US007081755B2

(12) United States Patent  
Klang et al.

(10) Patent No.: US 7,081,755 B2
(45) Date of Patent: Jul. 25, 2006

(54) BATTERY TESTER CAPABLE OF PREDICTING A DISCHARGE VOLTAGE/DISCHARGE CURRENT OF A BATTERY

(75) Inventors: James K. Klang, Downers Grove, IL (US); Gregory P. Fang, Darien, IL (US)

(73) Assignee: Midtronics, Inc., Willowbrook, IL (US)

( * ) Notice: Subject to any disclaimer, the term of this patent is extended or adjusted under 35 U.S.C. 154(b) by 252 days.

(21) Appl. No.: 10/654,098

(22) Filed: Sep. 3, 2003

(65) Prior Publication Data

US 2004/0046564 A1 Mar. 11, 2004

Related U.S. Application Data

(60) Provisional application No. 60/437,224, filed on Dec. 31, 2002, provisional application No. 60/408,542, filed on Sep. 5, 2002.

(51) Int. Cl.
*G01N 27/416* (2006.01)

(52) U.S. Cl. .................................................... 324/426

(58) Field of Classification Search ................ 320/104, 320/132, 150; 324/426, 427, 430, 433
See application file for complete search history.

(56) References Cited

U.S. PATENT DOCUMENTS

| 2,514,745 A | 7/1950 | Dalzell |
| 3,356,936 A | 12/1967 | Smith |
| 3,562,634 A | 2/1971 | Latner |
| 3,593,099 A | 7/1971 | Scholl |
| 3,607,673 A | 9/1971 | Seyl |
| 3,676,770 A | 7/1972 | Sharaf et al. |
| 3,729,989 A | 5/1973 | Little |
| 3,753,094 A | 8/1973 | Furuishi et al. |
| 3,808,522 A | 4/1974 | Sharaf |
| 3,811,089 A | 5/1974 | Strezelewicz |
| 3,873,911 A | 3/1975 | Champlin |
| 3,876,931 A | 4/1975 | Godshalk |
| 3,886,443 A | 5/1975 | Miyakawa et al. |
| 3,889,248 A | 6/1975 | Ritter |
| 3,906,329 A | 9/1975 | Bader |
| 3,909,708 A | 9/1975 | Champlin |
| 3,936,744 A | 2/1976 | Perlmutter |
| 3,946,299 A | 3/1976 | Christianson et al. |
| 3,947,757 A | 3/1976 | Grube et al. |
| 3,969,667 A | 7/1976 | McWilliams |
| 3,979,664 A | 9/1976 | Harris |
| 3,984,762 A | 10/1976 | Dowgiallo, Jr. |
| 3,984,768 A | 10/1976 | Staples |
| 3,989,544 A | 11/1976 | Santo |
| 4,008,619 A | 2/1977 | Alcaide et al. |
| 4,024,953 A | 5/1977 | Nailor, III |
| 4,047,091 A | 9/1977 | Hutchines et al. |
| 4,053,824 A | 10/1977 | Dupuis et al. |
| 4,070,624 A | 1/1978 | Taylor |
| 4,086,531 A | 4/1978 | Bernier |
| 4,112,351 A | 9/1978 | Back et al. |
| 4,114,083 A | 9/1978 | Benham et al. |
| 4,126,874 A | 11/1978 | Suzuki et al. |
| 4,178,546 A | 12/1979 | Hulls et al. |
| 4,193,025 A | 3/1980 | Frailing et al. |
| 4,207,611 A | 6/1980 | Gordon |
| 4,217,645 A | 8/1980 | Barry et al. |
| 4,297,639 A | 10/1981 | Branham |
| 4,315,204 A | 2/1982 | Sievers et al. |
| 4,316,185 A | 2/1982 | Watrous et al. |
| 4,322,685 A | 3/1982 | Frailing et al. |
| 4,351,405 A | 9/1982 | Fields et al. |
| 4,361,809 A | 11/1982 | Bil et al. |
| 4,363,407 A | 12/1982 | Buckler et al. |
| 4,369,407 A | 1/1983 | Korbell |
| 4,379,989 A | 4/1983 | Kurz et al. |
| 4,379,990 A | 4/1983 | Sievers et al. |
| 4,385,269 A | 5/1983 | Aspinwall et al. |
| 4,390,828 A | 6/1983 | Converse et al. |
| 4,392,101 A | 7/1983 | Saar et al. |
| 4,396,880 A | 8/1983 | Windebank |
| 4,408,157 A | 10/1983 | Beaubien |
| 4,412,169 A | 10/1983 | Dell'Orto |
| 4,423,378 A | 12/1983 | Marino et al. |
| 4,423,379 A | 12/1983 | Jacobs et al. |
| 4,424,491 A | 1/1984 | Bobbett et al. |
| 4,459,548 A | 7/1984 | Lentz et al. |
| 4,514,694 A | 4/1985 | Finger |

(Continued)

FOREIGN PATENT DOCUMENTS

DE        29 26 716 B1    1/1981

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner*—Edward H. Tso
(74) *Attorney, Agent, or Firm*—Westman, Champlin & Kelly

(57) ABSTRACT

A method and apparatus is provided for determining how a vehicle battery would perform when used to start a vehicle. A discharge voltage/current of the battery is predicted as a function of a battery dynamic parameter, an open circuit voltage of the battery, a battery temperature and a fixed current/voltage value at which the battery is to be discharged. This discharge voltage/current value is compared to a minimum starting voltage/current required to start the vehicle in which the battery is employed and an output indicative of a starting capability of the battery is provided.

20 Claims, 3 Drawing Sheets

U.S. PATENT DOCUMENTS

| | | | |
|---|---|---|---|
| 4,520,353 A | 5/1985 | McAuliffe |
| 4,564,798 A | 1/1986 | Young |
| 4,633,418 A | 12/1986 | Bishop |
| 4,659,977 A | 4/1987 | Kissel et al. |
| 4,663,580 A | 5/1987 | Wortman |
| 4,665,370 A | 5/1987 | Holland |
| 4,667,143 A | 5/1987 | Cooper et al. |
| 4,667,279 A | 5/1987 | Maier |
| 4,678,998 A | 7/1987 | Muramatsu |
| 4,679,000 A | 7/1987 | Clark |
| 4,680,528 A | 7/1987 | Mikami et al. |
| 4,686,442 A | 8/1987 | Radomski |
| 4,697,134 A | 9/1987 | Burkum et al. |
| 4,707,795 A | 11/1987 | Alber et al. |
| 4,709,202 A | 11/1987 | Koenck et al. |
| 4,710,861 A | 12/1987 | Kanner |
| 4,719,428 A | 1/1988 | Liebermann |
| 4,743,855 A | 5/1988 | Randin et al. |
| 4,745,349 A | 5/1988 | Palanisamy et al. |
| 4,816,768 A | 3/1989 | Champlin |
| 4,820,966 A | 4/1989 | Fridman |
| 4,825,170 A | 4/1989 | Champlin |
| 4,847,547 A | 7/1989 | Eng, Jr. et al. |
| 4,849,700 A | 7/1989 | Morioka et al. |
| 4,876,495 A | 10/1989 | Palanisamy et al. |
| 4,881,038 A | 11/1989 | Champlin |
| 4,888,716 A | 12/1989 | Ueno |
| 4,912,416 A | 3/1990 | Champlin |
| 4,913,116 A | 4/1990 | Katogi et al. |
| 4,929,931 A | 5/1990 | McCuen |
| 4,931,738 A | 6/1990 | MacIntyre et al. |
| 4,937,528 A | 6/1990 | Palanisamy |
| 4,947,124 A | 8/1990 | Hauser |
| 4,956,597 A | 9/1990 | Heavey et al. |
| 4,968,941 A | 11/1990 | Rogers |
| 4,968,942 A | 11/1990 | Palanisamy |
| 5,004,979 A | 4/1991 | Marino et al. |
| 5,032,825 A | 7/1991 | Kuznicki |
| 5,037,778 A | 8/1991 | Stark et al. |
| 5,047,722 A | 9/1991 | Wurst et al. |
| 5,087,881 A | 2/1992 | Peacock |
| 5,095,223 A | 3/1992 | Thomas |
| 5,126,675 A | 6/1992 | Yang |
| 5,140,269 A | 8/1992 | Champlin |
| 5,144,218 A | 9/1992 | Bosscha |
| 5,144,248 A | 9/1992 | Alexandres et al. |
| 5,160,881 A | 11/1992 | Schramm et al. |
| 5,170,124 A | 12/1992 | Blair et al. |
| 5,179,335 A | 1/1993 | Nor |
| 5,194,799 A | 3/1993 | Tomantschger |
| 5,204,611 A | 4/1993 | Nor et al. |
| 5,214,370 A | 5/1993 | Harm et al. |
| 5,214,385 A | 5/1993 | Gabriel et al. |
| 5,241,275 A | 8/1993 | Fang |
| 5,254,952 A | 10/1993 | Salley et al. |
| 5,266,880 A | 11/1993 | Newland |
| 5,281,919 A | 1/1994 | Palanisamy |
| 5,281,920 A | 1/1994 | Wurst |
| 5,295,078 A | 3/1994 | Stich et al. |
| 5,298,797 A | 3/1994 | Redl |
| 5,300,874 A | 4/1994 | Shimamoto et al. |
| 5,302,902 A | 4/1994 | Groehl |
| 5,315,287 A | 5/1994 | Sol |
| 5,321,626 A | 6/1994 | Palladino |
| 5,331,268 A | 7/1994 | Patino et al. |
| 5,336,993 A | 8/1994 | Thomas et al. |
| 5,338,515 A | 8/1994 | Dalla Betta et al. |
| 5,339,018 A | 8/1994 | Brokaw |
| 5,343,380 A | 8/1994 | Champlin |
| 5,347,163 A | 9/1994 | Yoshimura |
| 5,352,968 A | 10/1994 | Reni et al. |
| 5,365,160 A | 11/1994 | Leppo et al. |
| 5,365,453 A | 11/1994 | Startup et al. |
| 5,381,096 A | 1/1995 | Hirzel |
| 5,412,323 A | 5/1995 | Kato et al. |
| 5,426,371 A | 6/1995 | Salley et al. |
| 5,426,416 A | 6/1995 | Jefferies et al. |
| 5,432,426 A | 7/1995 | Yoshida |
| 5,434,495 A | 7/1995 | Toko |
| 5,435,185 A | 7/1995 | Eagan |
| 5,442,274 A | 8/1995 | Tamai |
| 5,445,026 A | 8/1995 | Eagan |
| 5,449,996 A | 9/1995 | Matsumoto et al. |
| 5,449,997 A | 9/1995 | Gilmore et al. |
| 5,451,881 A | 9/1995 | Finger |
| 5,457,377 A | 10/1995 | Jonsson |
| 5,469,043 A | 11/1995 | Cherng et al. |
| 5,485,090 A | 1/1996 | Stephens |
| 5,488,300 A | 1/1996 | Jamieson |
| 5,519,383 A | 5/1996 | De La Rosa |
| 5,528,148 A | 6/1996 | Rogers |
| 5,537,967 A | 7/1996 | Tashiro et al. |
| 5,541,489 A | 7/1996 | Dunstan |
| 5,546,317 A | 8/1996 | Andrieu |
| 5,548,273 A | 8/1996 | Nicol et al. |
| 5,550,485 A | 8/1996 | Falk |
| 5,561,380 A | 10/1996 | Sway-Tin et al. |
| 5,562,501 A | 10/1996 | Kinoshita et al. |
| 5,563,496 A | 10/1996 | McClure |
| 5,572,136 A | 11/1996 | Champlin |
| 5,574,355 A | 11/1996 | McShane et al. |
| 5,578,915 A | 11/1996 | Crouch, Jr. et al. |
| 5,583,416 A | 12/1996 | Klang |
| 5,585,728 A | 12/1996 | Champlin |
| 5,589,757 A | 12/1996 | Klang |
| 5,592,093 A | 1/1997 | Klingbiel |
| 5,596,260 A | 1/1997 | Moravec et al. |
| 5,598,098 A | 1/1997 | Champlin |
| 5,602,462 A | 2/1997 | Stich et al. |
| 5,606,242 A | 2/1997 | Hull et al. |
| 5,621,298 A | 4/1997 | Harvey |
| 5,633,985 A | 5/1997 | Severson et al. |
| 5,637,978 A | 6/1997 | Kellett et al. |
| 5,642,031 A | 6/1997 | Brotto |
| 5,650,937 A | 7/1997 | Bounaga |
| 5,652,501 A | 7/1997 | McClure et al. |
| 5,653,659 A | 8/1997 | Kunibe et al. |
| 5,656,920 A | 8/1997 | Cherng et al. |
| 5,675,234 A | 10/1997 | Greene |
| 5,677,077 A | 10/1997 | Faulk |
| 5,699,050 A | 12/1997 | Kanazawa |
| 5,701,089 A | 12/1997 | Perkins |
| 5,705,929 A | 1/1998 | Caravello et al. |
| 5,710,503 A | 1/1998 | Sideris et al. |
| 5,711,648 A | 1/1998 | Hammerslag |
| 5,717,336 A | 2/1998 | Basell et al. |
| 5,717,937 A | 2/1998 | Fritz |
| 5,739,667 A | 4/1998 | Matsuda et al. |
| 5,747,909 A | 5/1998 | Syverson et al. |
| 5,754,417 A | 5/1998 | Nicollini |
| 5,757,192 A | 5/1998 | McShane et al. |
| 5,760,587 A | 6/1998 | Harvey |
| 5,773,978 A | 6/1998 | Becker |
| 5,789,899 A | 8/1998 | van Phuoc et al. |
| 5,793,359 A | 8/1998 | Ushikubo |
| 5,796,239 A | 8/1998 | van Phuoc et al. |
| 5,808,469 A | 9/1998 | Kopera |
| 5,818,234 A | 10/1998 | McKinnon |
| 5,821,756 A | 10/1998 | McShane et al. |
| 5,821,757 A | 10/1998 | Alvarez et al. |
| 5,825,174 A | 10/1998 | Parker |
| 5,831,435 A | 11/1998 | Troy |
| 5,862,515 A | 1/1999 | Kobayashi et al. |
| 5,872,443 A | 2/1999 | Williamson |

| | | |
|---|---|---|
| 5,895,440 A | 4/1999 | Proctor et al. |
| 5,914,605 A | 6/1999 | Bertness |
| 5,927,938 A | 7/1999 | Hammerslag |
| 5,929,609 A | 7/1999 | Joy et al. |
| 5,939,855 A | 8/1999 | Proctor et al. |
| 5,939,861 A | 8/1999 | Joko et al. |
| 5,945,829 A | 8/1999 | Bertness |
| 5,951,229 A | 9/1999 | Hammerslag |
| 5,961,561 A | 10/1999 | Wakefield, II |
| 5,961,604 A | 10/1999 | Anderson et al. |
| 5,969,625 A | 10/1999 | Russo |
| 6,002,238 A | 12/1999 | Champlin |
| 6,008,652 A | 12/1999 | Theofanopoulos et al. |
| 6,009,369 A | 12/1999 | Boisvert et al. |
| 6,031,354 A | 2/2000 | Wiley et al. |
| 6,037,751 A | 3/2000 | Klang |
| 6,037,777 A | 3/2000 | Champlin |
| 6,051,976 A | 4/2000 | Bertness |
| 6,061,638 A | 5/2000 | Joyce |
| 6,072,299 A | 6/2000 | Kurle et al. |
| 6,072,300 A | 6/2000 | Tsuji |
| 6,081,098 A | 6/2000 | Bertness et al. |
| 6,091,245 A | 7/2000 | Bertness |
| 6,094,033 A | 7/2000 | Ding et al. |
| 6,104,167 A | 8/2000 | Bertness et al. |
| 6,114,834 A | 9/2000 | Parise |
| 6,137,269 A | 10/2000 | Champlin |
| 6,140,797 A | 10/2000 | Dunn |
| 6,144,185 A | 11/2000 | Dougherty et al. |
| 6,150,793 A | 11/2000 | Lesesky et al. |
| 6,161,640 A | 12/2000 | Yamaguchi |
| 6,163,156 A | 12/2000 | Bertness |
| 6,167,349 A | 12/2000 | Alvarez |
| 6,172,483 B1 | 1/2001 | Champlin |
| 6,172,505 B1 | 1/2001 | Bertness |
| 6,181,545 B1 | 1/2001 | Amatucci et al. |
| 6,222,369 B1 | 4/2001 | Champlin |
| 6,225,808 B1 | 5/2001 | Varghese et al. |
| 6,236,332 B1 | 5/2001 | Conkright et al. |
| 6,249,124 B1 | 6/2001 | Bertness |
| 6,250,973 B1 | 6/2001 | Lowery et al. |
| 6,254,438 B1 | 7/2001 | Gaunt |
| 6,259,254 B1 | 7/2001 | Klang |
| 6,262,563 B1 | 7/2001 | Champlin |
| 6,263,268 B1 | 7/2001 | Nathanson |
| 6,294,896 B1 | 9/2001 | Champlin |
| 6,294,897 B1 | 9/2001 | Champlin |
| 6,304,087 B1 | 10/2001 | Bertness |
| 6,307,349 B1 | 10/2001 | Koenck et al. |
| 6,310,481 B1 | 10/2001 | Bertness |
| 6,313,607 B1 | 11/2001 | Champlin |
| 6,313,608 B1 | 11/2001 | Varghese et al. |
| 6,316,914 B1 | 11/2001 | Bertness |
| 6,323,650 B1 | 11/2001 | Bertness et al. |
| 6,329,793 B1 | 12/2001 | Bertness et al. |
| 6,331,762 B1 * | 12/2001 | Bertness ............ 320/134 |
| 6,332,113 B1 | 12/2001 | Bertness |
| 6,346,795 B1 | 2/2002 | Haraguchi et al. |
| 6,347,958 B1 | 2/2002 | Tsai |
| 6,351,102 B1 | 2/2002 | Troy |
| 6,359,441 B1 | 3/2002 | Bertness |
| 6,359,442 B1 | 3/2002 | Henningson et al. |
| 6,363,303 B1 | 3/2002 | Bertness |
| 6,384,608 B1 | 5/2002 | Namaky |
| 6,388,448 B1 | 5/2002 | Cervas |
| 6,392,414 B1 | 5/2002 | Bertness |
| 6,411,098 B1 | 6/2002 | Laletin |
| 6,417,669 B1 | 7/2002 | Champlin |
| 6,424,157 B1 | 7/2002 | Gollomp et al. |
| 6,424,158 B1 | 7/2002 | Klang |
| 6,441,585 B1 * | 8/2002 | Bertness ............ 320/132 |
| 6,445,158 B1 | 9/2002 | Bertness et al. |
| 6,456,045 B1 | 9/2002 | Troy et al. |
| 6,466,025 B1 | 10/2002 | Klang |
| 6,466,026 B1 | 10/2002 | Champlin |
| 6,495,990 B1 | 12/2002 | Champlin |
| 6,534,993 B1 | 3/2003 | Bertness |
| 6,544,078 B1 | 4/2003 | Palmisano et al. |
| 6,556,019 B1 | 4/2003 | Bertness |
| 6,566,883 B1 | 5/2003 | Vonderhaar et al. |
| 6,586,941 B1 | 7/2003 | Bertness et al. |
| 6,597,150 B1 | 7/2003 | Bertness et al. |
| 2002/0171428 A1 | 11/2002 | Bertness |

FOREIGN PATENT DOCUMENTS

| | | |
|---|---|---|
| EP | 0 022 450 A1 | 1/1981 |
| EP | 0 637 754 A1 | 2/1995 |
| EP | 0 772 056 A1 | 5/1997 |
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| RU | 2089015 C1 | 8/1997 |
| WO | WO 93/22666 | 11/1993 |
| WO | WO 94/05069 | 3/1994 |
| WO | WO 98/04910 | 2/1998 |
| WO | WO 98/58270 | 12/1998 |
| WO | WO 99/23738 | 5/1999 |
| WO | WO 00/62049 | 10/2000 |
| WO | WO 00/67359 | 11/2000 |
| WO | WO 01/51947 | 7/2001 |

OTHER PUBLICATIONS

"Battery Impedance", by E. Willihnganz et al., *Electrical Engineering*, Sep. 1959, pp. 922-925.

"Determining The End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.

IEEE Recommended Practice For Maintenance, Testings, and Replacement of Large Lead Storage Batteries for Generating Stations and Substations, *The Institute of Electrical and Electronics Engineers, Inc.*, ANSI/IEEE Std. 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"Battery Impedance", by E. Willihnganz et al., *Electrical Engineering*, Sep. 1959, pp. 922-925.

"JIS Japanese Industrial Standard-Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.

Burr-Brown Corporation, "Design A 60 Hz Notch Filter with the UAF42", Jan. 1994, AB-071, 1994.

National Semiconductor Corporation, "LMF90-4th-Order Elliptic Notch Filter", Dec. 1994, RRD-B30M115, Dec. 1994.

"Alligator Clips with Wire Penetrators" *J.S. Popper, Inc.* product information, downloaded from http://www.jspopper.com/, undated.

" #12: LM78S40 Simple Switcher DC to DC Converter", *ITM e-Catalog*, downloaded from http://www.pcbcafe.com, undated.

"Simple DC-DC Converts Allows Use of Single Battery", *Electronix Express*, downloaded from http://www.elexp.com/t_dc-dc.htm, undated.

"DC-DC Converter Basics", *Power Designers*, downloaded from http://www.powederdesigners.com/InforWeb.design_center/articles/DC-DC/converter.shtm, undated.

"Notification of Transmittal of The International Search Report or the Declaration", PCT/US02/29461.

"Notification of Transmittal of The International Search Report or the Declaration", PCT/US03/07546.

"Notification of Transmittal of The International Search Report or the Declaration", PCT/US03/06577.

* cited by examiner

BATTERY TESTER CAPABLE OF PREDICTING A DISCHARGE VOLTAGE/DISCHARGE CURRENT OF A BATTERY

CROSS REFERENCE TO RELATED APPLICATIONS

The present application is based on and claims the benefit of U.S. provisional patent application Ser. No. 60/408,542, filed Sep. 5, 2002, and U.S. provisional patent application Ser. No. 60/437,224, filed Dec. 31, 2002, the contents of which are hereby incorporated by reference in its entirety.

BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM, U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/960,117, filed Sep. 20, 2001, entitled IN-VEHICLE BATTERY MONITOR; U.S. Ser. No. 09/908,278, filed Jul. 18, 2001, entitled BATTERY CLAMP WITH EMBEDDED ENVIRONMENT SENSOR; U.S. Ser. No. 09/880,473, filed Jun. 13, 2001; entitled BATTERY TEST MODULE; U.S. Ser. No. 09/940,684, filed Aug. 27, 2001, entitled METHOD AND APPARATUS FOR EVALUATING STORED CHARGE IN AN ELECTROCHEMICAL CELL OR BATTERY; U.S. Ser. No. 60/330,441, filed Oct. 17, 2001, entitled ELECTRONIC BATTERY TESTER WITH RELATIVE TEST OUTPUT; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 09/992,350, filed Nov. 26, 2001, entitled ELECTRONIC BATTERY TESTER, U.S. Ser. No. 60/341,902, filed Dec. 19, 2001, entitled BATTERY TESTER MODULE; U.S. Ser. No. 10/042,451, filed Jan. 8, 2002, entitled BATTERY CHARGE CONTROL DEVICE, U.S. Ser. No. 10/073,378, filed Feb. 8, 2002, entitled METHOD AND APPARATUS USING A CIRCUIT MODEL TO EVALUATE CELL/BATTERY PARAMETERS; U.S. Ser. No. 10/093,853, filed Mar. 7, 2002, entitled ELECTRONIC BATTERY TESTER WITH NETWORK COMMUNICATION; U.S. Ser. No. 60/364,656, filed Mar. 14, 2002, entitled ELECTRONIC BATTERY TESTER WITH LOW TEMPERATURE RATING DETERMINATION; U.S. Ser. No. 10/098,741, filed Mar. 14, 2002, entitled METHOD AND APPARATUS FOR AUDITING A BATTERY TEST; U.S. Ser. No. 10/112,114, filed Mar. 28, 2002; U.S. Ser. No. 10/109,734, filed Mar. 28, 2002; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 60/379,281, filed May 8, 2002, entitled METHOD FOR DETERMINING BATTERY STATE OF CHARGE; U.S. Ser. No. 60/387,046, filed Jun. 7, 2002, entitled METHOD AND APPARATUS FOR INCREASING THE LIFE OF A STORAGE BATTERY; U.S. Ser. No. 10/177,635, filed Jun. 21, 2002, entitled BATTERY CHARGER WITH BOOSTER PACK; U.S. Ser. No. 10/207,495, filed Jul. 29, 2002, entitled KELVIN CLAMP FOR ELECTRICALLY COUPLING TO A BATTERY CONTACT; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 60/408,542, filed Sep. 5, 2002, entitled BATTERY TEST OUTPUTS ADJUSTED BASED UPON TEMPERATURE; U.S. Ser. No. 10/246,439, filed Sep. 18, 2002, entitled BATTERY TESTER UPGRADE USING SOFTWARE KEY; U.S. Ser. No. 60/415,399, filed Oct. 2, 2002, entitled QUERY BASED ELECTRONIC BATTERY TESTER; and U.S. Ser. No. 10/263,473, filed Oct. 2, 2002, entitled ELECTRONIC BATTERY TESTER WITH RELATIVE TEST OUTPUT; U.S. Ser. No. 60/415,796, filed Oct. 3, 2002, entitled QUERY BASED ELECTRONIC BATTERY TESTER; U.S. Ser. No. 10/271,342, filed Oct. 15, 2002, entitled IN-VEHICLE BATTERY MONITOR; U.S. Ser. No. 10/270,777, filed Oct. 15, 2002, entitled PROGRAMMABLE CURRENT EXCITER FOR MEASURING AC IMMITTANCE OF CELLS AND BATTERIES; U.S. Ser. No. 10/310,515, filed Dec. 5, 2002, entitled BATTERY TEST MODULE; U.S. Ser. No. 10/310,490, filed Dec. 5, 2002, entitled ELECTRONIC BATTERY TESTER; U.S. Ser. No. 10/310,385, filed Dec. 5, 2002, entitled BATTERY TEST MODULE, U.S. Ser. No. 60/437,255, filed Dec. 31, 2002, entitled REMAINING TIME PREDICTIONS, U.S. Ser. No. 60/437,224, filed Dec. 31, 2002, entitled DISCHARGE VOLTAGE PREDICTIONS, U.S. Ser. No. 10/349,053, filed Jan. 22, 2003, entitled APPARATUS AND METHOD FOR PROTECTING A BATTERY FROM OVERDISCHARGE, U.S. Ser. No. 10/388,855, filed Mar. 14, 2003, entitled ELECTRONIC BATTERY TESTER WITH BATTERY FAILURE TEMPERATURE DETERMINATION, U.S. Ser. No. 10/396,550, filed Mar. 25, 2003, entitled ELECTRONIC BATTERY TESTER, U.S. Ser. No. 60/467,872, filed May 5, 2003, entitled METHOD FOR DETERMINING BATTERY STATE OF CHARGE, U.S. Ser. No. 60/477,082, filed Jun. 9, 2003, entitled ALTERNATOR TESTER, U.S. Ser. No. 10/460,749, filed Jun. 12, 2003, entitled MODULAR BATTERY TESTER FOR SCAN TOOL, U.S. Ser. No. 10/462,323, filed Jun. 16, 2003, entitled ELECTRONIC BATTERY TESTER HAVING A USER INTERFACE TO CONFIGURE A PRINTER, U.S. Ser. No. 10/601,608, filed Jun. 23, 2003, entitled CABLE FOR ELECTRONIC BATTERY TESTER, U.S. Ser. No. 10/601,432, filed Jun. 23, 2003, entitled BATTERY TESTER CABLE WITH MEMORY; U.S. Ser. No. 60/490,153, filed Jul. 25, 2003, entitled SHUNT CONNECTION TO A PCB FOR AN ENERGY MANAGEMENT SYSTEM EMPLOYED IN AN AUTOMOTIVE VEHICLE, which are incorporated herein in their entirety.

In general, prior art battery testers determine whether the battery falls in a "good" or "bad" category. However, such general categorizations or test results are insufficient for predicting whether the battery is capable of providing a sufficient voltage and/or current to start a vehicle in which the battery is employed, for example.

SUMMARY OF THE INVENTION

The present invention is directed to the use of a dynamic battery parameter, coupled with battery voltage, temperature, etc., to determine how a vehicle battery would perform when used to start the vehicle. A method and apparatus for testing a storage battery is provided in which a battery is measured to obtain a battery dynamic parameter value such as conductance. The battery is measured to obtain an open circuit voltage and a battery temperature. A discharge voltage of the battery is predicted as a function of the battery dynamic parameter, the open circuit voltage, the battery temperature value and a fixed current value at which the battery is to be discharged. This discharge voltage value is compared to a minimum starting voltage required to start a vehicle in which the battery is employed and an output indicative of a starting capability of the battery is provided. Also, a discharge current of the battery can be predicted as a function of the battery dynamic parameter, the open circuit voltage, the battery temperature value and a fixed voltage value at which the battery is to be discharged. This discharge current value is compared to a minimum starting current required to start a vehicle in which the battery is employed and an output indicative of a starting capability of the battery is provided.

DETAILED DESCRIPTION OF THE PREFERRED EMBODIMENTS

The present invention provides a method and apparatus for determining vehicle battery test outputs that are a function of battery temperature and/or the state of discharge of the battery. The outputs provided include a discharge voltage (instantaneous voltage akin to a vehicle starting voltage that the vehicle battery will deliver) at a fixed current, and a discharge current (instantaneous current akin to a vehicle starting current that the vehicle battery will deliver) at a fixed voltage.

In accordance with the present invention, the discharge voltage and discharge current predictions can be made over a wide range of conditions (battery temperature, state of discharge, etc.) using a non-intrusive test method (no high current loads). The non-intrusive test method includes measuring the battery to obtain a battery dynamic parameter such as conductance of the battery and utilizing the conductance and other information about the battery, discussed further below, to predict the discharge voltage and discharge current. Although the example embodiments of the present invention described below relate to predicting discharge voltage and current values from battery conductance measurements, dynamic parameters other than battery conductance may be utilized without departing from the spirit and scope of the invention. Examples of other dynamic parameters include dynamic resistance, admittance, impedance, reactance, susceptance or their combinations.

Figure 1:
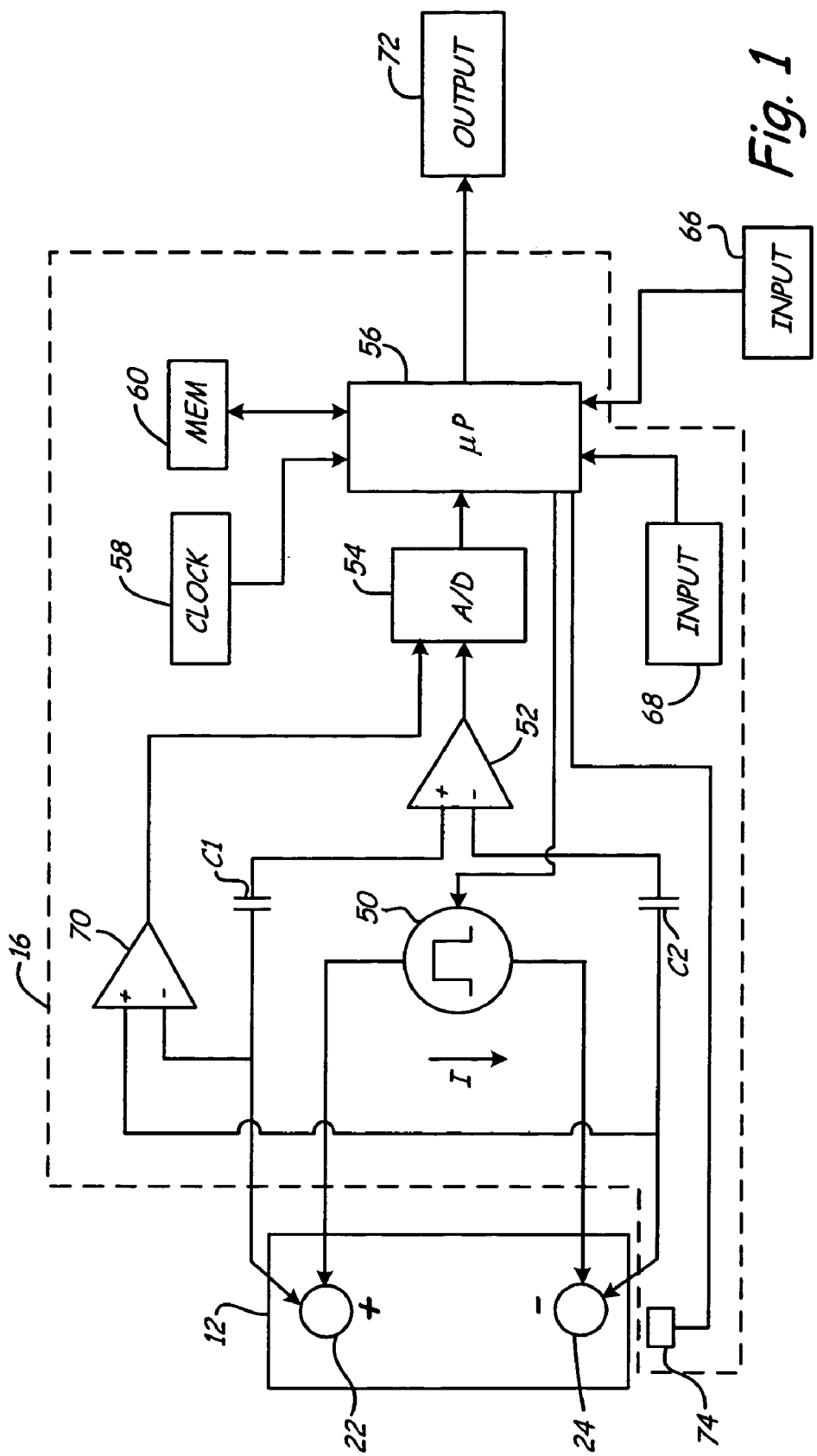
FIG. 1 is a simplified schematic diagram showing battery test circuitry in accordance with the present invention.

FIG. 1 is a simplified block diagram of battery test circuitry 16, capable of providing the above-mentioned test results, in accordance with an embodiment of the present invention. Apparatus 16 is shown coupled to a vehicle battery 12, which includes a positive battery terminal 22 and a negative battery terminal 24.

In preferred embodiments, circuitry 16 operates, with the exceptions and additions as discussed below, in accordance with battery testing methods described in one or more of the United States patents obtained by Dr. Champlin and Midtronics, Inc. and listed above. Circuitry 16 operates in accordance with one embodiment of the present invention and determines the conductance (G) of battery 12 and the open circuit voltage (OCV) between terminals 22 and 24 of battery 12. Circuitry 16 includes current source 50, differential amplifier 52, analog-to-digital converter 54 and microprocessor 56. Amplifier 52 is capacitively coupled to battery 12 through capacitors $C_1$ and $C_2$. Amplifier 52 has an output connected to an input of analog-to-digital converter 54. Microprocessor 56 is connected to system clock 58, memory 60 and analog-to-digital converter 54. Microprocessor 56 is also capable of receiving an input from input devices 66 and 68. Microprocessor 56 also connects to output device 72.

In operation, current source 50 is controlled by microprocessor 56 and provides a current I in the direction shown by the arrow in FIG. 1. In one embodiment, this is a square wave or a pulse. Differential amplifier 52 is connected to terminals 22 and 24 of battery 12 through capacitors $C_1$ and $C_2$, respectively, and provides an output related to the voltage potential difference between terminals 22 and 24. In a preferred embodiment, amplifier 52 has a high input impedance. Circuitry 16 includes differential amplifier 70 having inverting and noninverting inputs connected to terminals 24 and 22, respectively. Amplifier 70 is connected to measure the OCV of battery 12 between terminals 22 and 24. The output of amplifier 70 is provided to analog-to-digital converter 54 such that the voltage across terminals 22 and 24 can be measured by microprocessor 56.

Circuitry 16 is connected to battery 12 through a four-point connection technique known as a Kelvin connection. This Kelvin connection allows current I to be injected into battery 12 through a first pair of terminals while the voltage V across the terminals 22 and 24 is measured by a second pair of connections. Because very little current flows through amplifier 52, the voltage drop across the inputs to amplifier 52 is substantially identical to the voltage drop across terminals 22 and 24 of battery 12. The output of differential amplifier 52 is converted to a digital format and is provided to microprocessor 56. Microprocessor 56 operates at a frequency determined by system clock 58 and in accordance with programming instructions stored in memory 60.

Microprocessor 56 determines the conductance of battery 12 by applying a current pulse I using current source 50. The microprocessor determines the change in battery voltage due to the current pulse I using amplifier 52 and analog-to-digital converter 54. The value of current I generated by current source 50 is known and is stored in memory 60. Microprocessor 56 calculates the conductance (or reciprocally the resistance) of battery 12 using the following equation:

$$\text{Conductance} = G = \frac{\Delta I}{\Delta V} \qquad \text{Equation 1}$$

where $\Delta I$ is the change in current flowing through battery 12 due to current source 50 and $\Delta V$ is the change in battery voltage due to applied current $\Delta I$. In some embodiments circuitry 16 also includes a temperature sensor 74, coupled to microprocessor 56, that can be thermally coupled to battery 12 to thereby measure a temperature of battery 12 and provide the measured battery temperature value(s) to microprocessor 56. In the preferred embodiment, the battery temperature would be measured using an infrared signal from the outside of the battery. In other embodiments, instead of being measured, the temperature of battery 12 may be estimated or input by a tester user through input 66, for example. Microprocessor 56 can also use other information input from input device 66 provided by, for example, an operator. This information may consist of the particular type of battery, location, time, the name of the operator, the CCA rating of the battery, the rated load test voltage of the battery, etc.

Under the control of microprocessor 56, battery tester 16, in some embodiments, predicts a discharge voltage (instantaneous voltage akin to a vehicle starting voltage that the vehicle battery will deliver) at a fixed current. Further, battery tester 16 compares the predicted discharge voltage with a minimum starting voltage and, based on this comparison, provides an output, via output device 72, related to the ability of the battery to start the vehicle. The minimum starting voltage can be input through input device 66. Details regarding the derivation of an example algorithm utilized by battery tester 16 to predict the discharge voltage of battery 12 are provided below.

The calculations for determining the discharge voltage require the following information about the battery:
1) The OCV of the battery (measured between the terminals of the battery as described above).
2) The conductance or resistance of the battery (determined from Equation 1 above).
3) The battery temperature (obtained as described above).
4) The fixed current at which the battery is to be discharged (can be input through input device 66).

These values are combined to predict the discharge voltage that is akin to that seen by the vehicle starter.

The algorithm employs a novel extension of the familiar Ohm's law:

$$dV = dI*R \qquad \text{Equation 2}$$

or, $$V = Vo - I*R$$

or in the case of a battery, $$Vpred = Vo - I/G \qquad \text{Equation 3}$$

Where
Vpred=The predicted discharge voltage
Vo=An activation voltage
I=A desired high rate discharge current (fixed current value at which the battery is to be discharged)
G=The battery conductance While the last term I/G (Equation 3) can be readily calculated, the term Vo (Equation 3) cannot. It has been found that values of the OCV and the temperature of the battery can be utilized to derive expressions that calculate a value for Vo that, when combined with the I/G factor, relatively accurately predicts the discharge voltage over a wide battery temperature range and battery discharge. Equations such as the following can be used for a large starting battery:

$$Vo = 5.73*OCV^2 - 229.86*OCV - 13712.5/OCV + 3085.7 + 0.00783*T \qquad \text{Equation 4A}$$

For charged batteries the following equation can be utilized $$Vo = 11.03 + 0.0124*T - 0.000031*T^2 \qquad \text{Equation 4B}$$

where
T=the battery temperature in degrees Fahrenheit
OCV=the measured open circuit voltage of the battery It should be noted that, in general, a mathematical fit to a battery system needs to be applied prior to using the above-described method with low OCV's. For example, Equation 4A for Vo applies to a specific battery and may not be general to all batteries. Equation 4B is more universal because it is for charged batteries.

While Equation 4A demands a stable OCV value, this cannot always be measured, especially if the battery is being charged or discharged. This then can be calculated if the Ah discharged from a particular battery is known:

$$OCV = OCV_{100} - k*Ah \qquad \text{Equation 5}$$

where
$OCV_{100}$=the fully charged OCV of the battery.
Ah=Amp-hours discharged
k=a proportionality constant unique to a particular battery type In some embodiments, battery tester 16 predicts a discharge current (instantaneous current akin to a vehicle starting current that the vehicle battery will deliver) at a fixed voltage. Further, battery tester 16 compares the predicted discharge current with a minimum starting current and, based on this comparison, provides an output, via output device 72, related to the ability of the battery to start the vehicle. The minimum starting current can be input through input device 66. The following equation can be used to predict the discharge current:

$$Ipred = (Vo - V1)*G \qquad \text{Equation 6}$$

Where
Ipred=Predicted Cranking Amps
Vo=an activation voltage
G=Conductance
V1=Desired voltage of the battery with load applied (fixed voltage value at which the battery is to be discharged).

In some embodiments, battery tester 16 is capable of predicting both the discharge voltage and the discharge current. The discharge voltage and discharge current predictions are carried out as described above. It should be noted that the above mathematical relationships (Equations 1–6) are programmed into memory 60 of battery tester 16. Microprocessor 56 utilizes these programmed instructions to carry out the discharge voltage and/or current predictions.

Figure 2:
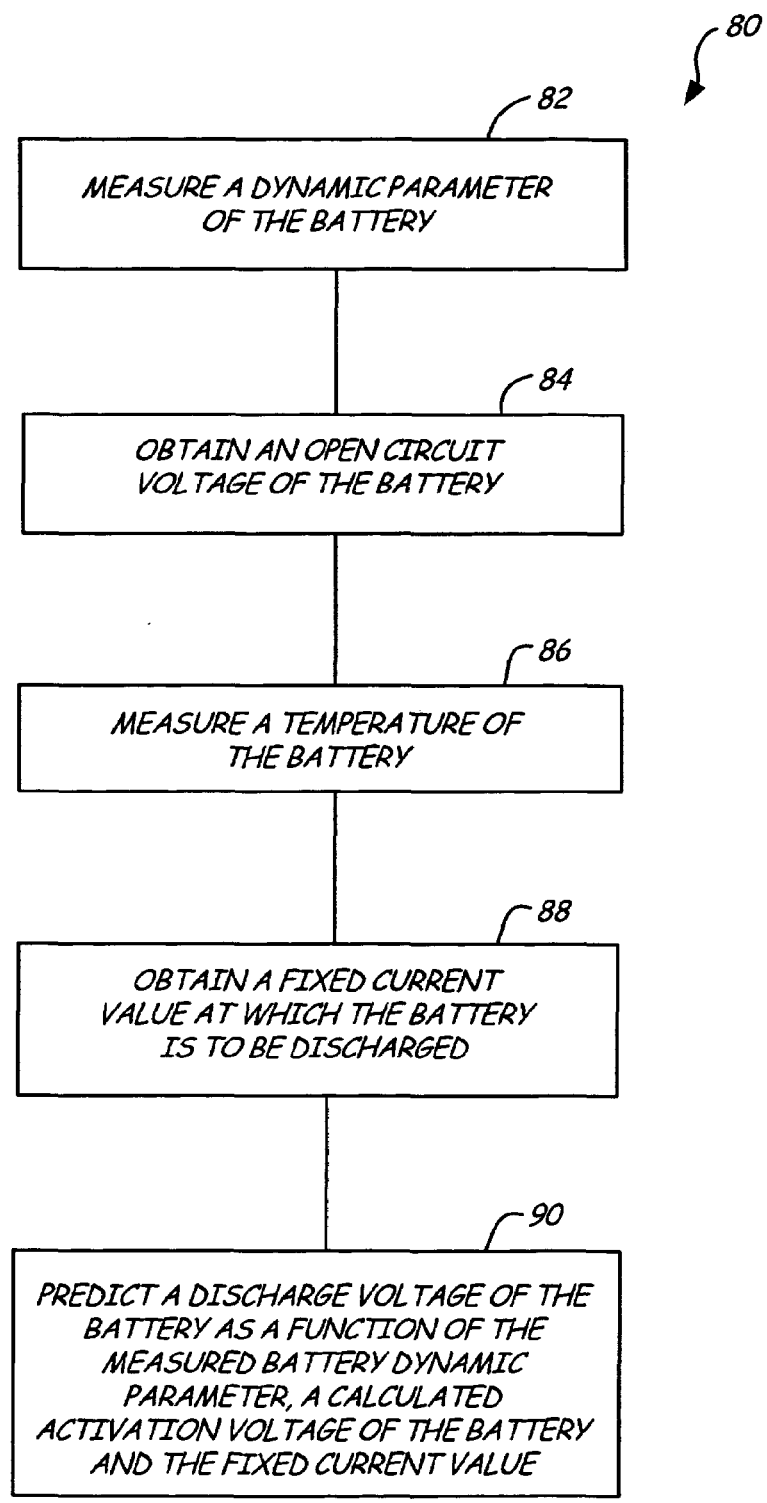
FIG. 2 is a simplified block diagram showing the steps of a method of testing a battery in accordance with the present invention.

FIG. 2 is a flowchart 80 showing steps of a method of testing a battery in accordance with an embodiment of the present invention. At step 82, a dynamic parameter of the battery is measured. At step 84, an open circuit voltage of the battery is obtained. At step 86, a temperature of the battery is measured. At step 88, a fixed current value at which the battery is to be discharged is obtained. At step 90, a discharge voltage of the battery is predicted as a function of the measured battery dynamic parameter, a calculated activation voltage of the battery and the fixed current value. Different techniques, some of which are set forth above, can be employed to carry out the steps shown in the flow chart of FIG. 2 while maintaining substantially the same functionality without departing from the scope and spirit of the present invention. Prediction of the discharge current is carried out in a manner similar to that shown in FIG. 2 with the exception of a fixed voltage value being employed in steps 88 and 90 instead of a fixed current value.

The above-described method of predicting discharge voltage and/or discharge current is especially useful for implementation in a battery monitor employed in an automotive vehicle. A vehicle battery monitor configured to carry out the above calculations (Equations 1–6) is described below in connection with FIG. 3.

Figure 3:
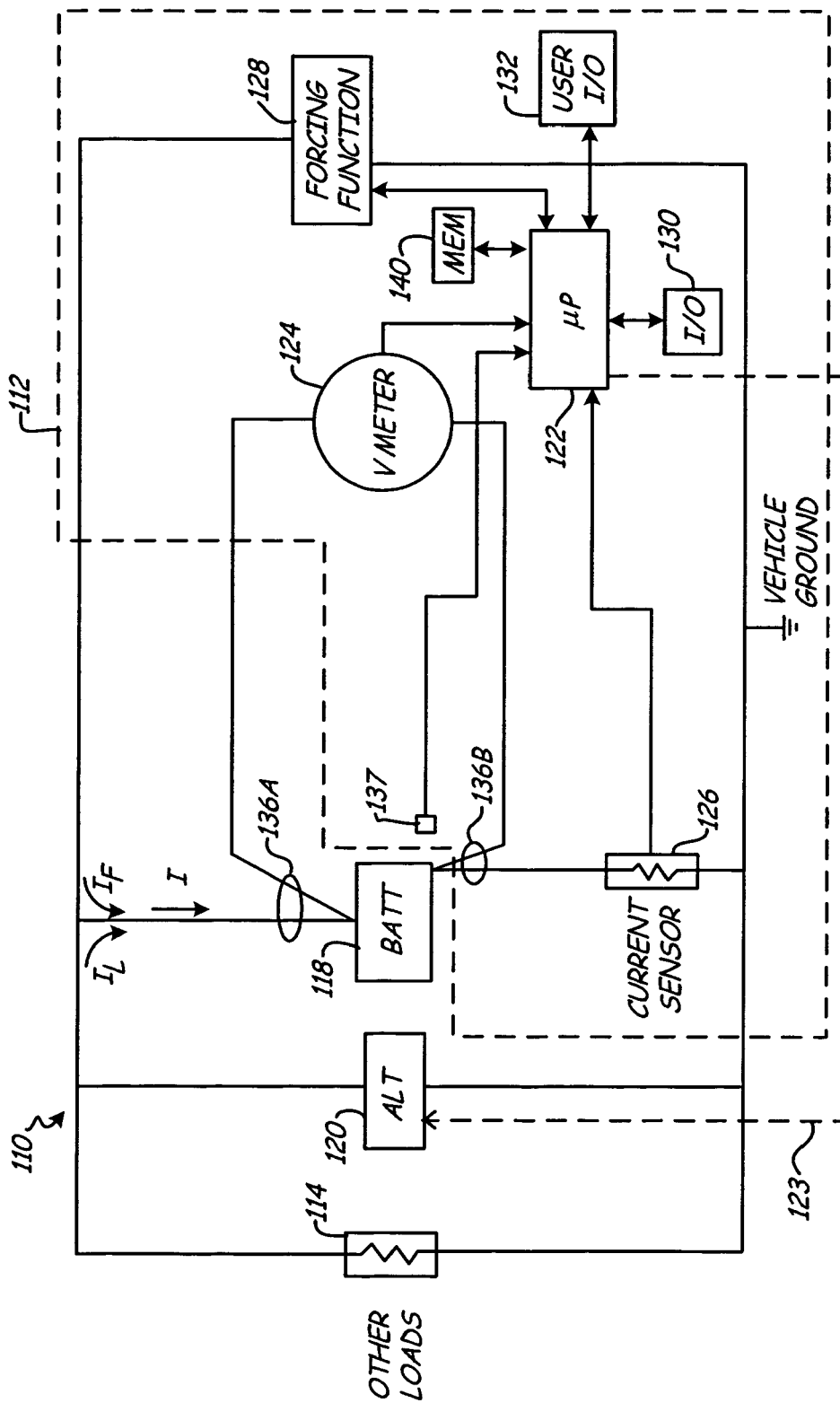
FIG. 3 is a simplified block diagram showing a system for monitoring a battery in a vehicle in accordance with an embodiment of the present invention.

FIG. 3 is a simplified block diagram showing an automotive vehicle 110 which includes a battery monitor 112 in accordance with one embodiment of the present invention. Vehicle 110 includes vehicle loads 114 which are shown schematically as an electrical resistance. A battery 118 is coupled to the vehicle load 114 and to an alternator 120. Alternator 120 couples to an engine of the vehicle 110 and is used to charge battery 118 and provide power to loads 114 during operation.

Battery monitor 112 operates, with the exceptions and additions as discussed below, in accordance with the battery monitor described and illustrated in U.S. Pat. No. 6,331,762, issued Dec. 18, 2001, and entitled ENERGY MANAGEMENT SYSTEM FOR AUTOMOTIVE VEHICLE which is incorporated herein by reference. In the embodiment illustrated in FIG. 3, battery monitor 112 includes a microprocessor 122 coupled to a voltage sensor 124, a current sensor 126 and a forcing function 128. Microprocessor 122, which is similar to microprocessor 56 of FIG. 1, may also include one or more inputs and outputs illustrated as I/O 130 adapted to couple to an external databus or to an internal databus associated with the vehicle 110. Further, a user input/output (I/O) 132 is provided for providing interaction with a vehicle operator. Microprocessor 122 is coupled to alternator 120 to provide a control output 123 to alternator 120 in response to inputs, alone or in various functional combinations, from current sensor 126, voltage sensor 124 and forcing function 128.

Battery monitor 112 is easily installed in a vehicle electrical system. A single shunt current sensor 126 must be inserted in one of the primary battery cables and a control line provided to allow control of alternator 120. The control can be by simply adjusting the voltage supplied to a voltage regulator of alternator 120 to thereby control charging of battery 118. The battery monitor 112 can be a separate, self-sufficient and self-contained monitor which operates without requiring interaction with other components of the vehicle, except in some embodiments, alternator 120.

FIG. 3 also illustrates a Kelvin connection formed by connections 136A and 136B to battery 118. With such a Kelvin connection, two couplings are provided to the positive and negative terminals of battery 118. This allows one of the electrical connections on each side of the battery to carry large amounts of current while the other pair of connections can be used to obtain accurate voltage readings. Because substantially no current is flowing through the voltage sensor 124, there will be little voltage drop through the electrical connection between sensor 124 and battery 118 thereby providing more accurate voltage measurements. Battery monitor 112 also includes a temperature sensor 137, coupled to microprocessor 122, that can be thermally coupled to battery 118 to thereby measure a temperature of battery 118 and provide the measured battery temperature value(s) to microprocessor 122.

In the specific embodiment illustrated in FIG. 3, the forcing function is a function which applies a signal having an AC or transient component to battery 118. The forcing function can be through the application of a load which provides a desired forcing function in which current is drawn from battery 118, or can be through active circuitry in which a current is injected into battery 118. This results in a current labeled $I_F$ in FIG. 3. The total current, I through battery 118 is due to both the forcing function current $I_F$ and the current flowing through loads 114, $I_L$. Current sensor 126 is positioned to sense the total current I. In a manner similar to that described in connection battery tester 16 (FIG. 1), the dynamic conductance (or reciprocally the resistance) of battery 118 can be calculated using Equation 1 above. Specifically, Microprocessor 122, using instructions for execution of Equations 1–6 that are stored in memory 140, computes the discharge voltage and/or the discharge current in a manner substantially similar to that described above in connection with battery tester 16 shown FIG. 1. Microprocessor 122 may be configured to activate the above-described test periodically and/or to carry out the test upon receipt of an activation signal from an activation device operated by the vehicle user, for example. Outputs regarding the starting capability of the battery are provided to the vehicle operator, for example, via user I/O 132. Any suitable hard wired or wireless communication techniques known in the industry or developed in the future may be employed to provide test activation signals to microprocessor 122 and to communicate test results from microprocessor 122 to output devices.

Although the present invention has been described with reference to preferred embodiments, workers skilled in the art will recognize that changes may be made in form and detail without departing from the spirit and scope of the invention.

What is claimed is:

1. A method of testing a storage battery, comprising:
   (a) measuring a dynamic parameter of the battery;
   (b) obtaining an open circuit voltage of the battery;
   (c) measuring a temperature of the battery;
   (d) obtaining a fixed current value at which the battery is to be discharged;
   (e) calculating an activation voltage based on the measured and obtained conditions of the battery in steps (b) and (c) ;nd
   (f) predicting a discharge voltage of the battery as a function of the measured battery dynamic parameter, the calculated activation voltage of the battery and the fixed current value, the discharge voltage indicative of a vehicle starting capability of the battery.

2. The method of claim 1 further comprising comparing the discharge voltage with a minimum starting voltage.

3. The method of claim 2 further comprising providing an output indicative of the vehicle starting capability of the battery based on the comparison of the discharge voltage with the minimum starting voltage.

4. The method of claim 1 wherein the dynamic parameter measurement step (a) comprises determining a response of the battery to an applied current pulse.

5. The method of claim 1 wherein the measured battery dynamic parameter is battery conductance.

6. The method of claim 1 wherein the measured battery dynamic parameter is battery resistance.

7. An electronic battery tester comprising:
- a positive connector coupled to a positive terminal of the battery;
- a negative connector coupled to a negative terminal of the battery;
- a voltage sensor configured to measure an open circuit voltage of the battery;
- a temperature sensor configured to measure a temperature of the battery;
- an input configured to receive a fixed current value at which the battery is to be discharged; and
- battery test circuitry configured to measure a dynamic parameter of the battery using the first and second connectors, and to predict a discharge voltage of the battery as a function of the measured battery dynamic parameter, a calculated activation voltage and the fixed current value.

8. The apparatus of claim 7 wherein the battery test circuitry is further configured to compare the discharge voltage with a minimum starting voltage.

9. The apparatus of claim 8 wherein the battery test circuitry is further configured to provide an output indicative of the vehicle starting capability of the battery based on the comparison of the discharge voltage with the minimum starting voltage.

10. The apparatus of claim 7 wherein the measured battery dynamic parameter is battery conductance.

11. The apparatus of claim 7 wherein the measured battery dynamic parameter is battery resistance.

12. A method of testing a storage battery, comprising:
(a) measuring a dynamic parameter of the battery;
(b) obtaining an open circuit voltage of the battery; and
(c) measuring a temperature of the battery;
(d) obtaining a fixed voltage value at which the battery is to be discharged;
(e) calculating an activation voltage based on the measured and obtained conditions of the battery in steps (b) and (c); and
(f) predicting a discharge current of the battery as a function of the measured battery dynamic parameter, the calculated activation voltage of the battery and the fixed voltage value, the discharge current indicative of a vehicle starting capability of the battery.

13. The method of claim 12 further comprising comparing the discharge current with a minimum starting current.

14. The method of claim 13 further comprising providing an output indicative of the vehicle starting capability of the battery based on the comparison of the discharge current with the minimum starting current.

15. An apparatus for monitoring the condition of a storage battery while the storage battery is coupled in parallel to an electrical system of an operating vehicle, comprising:
- a first electrical connection directly coupled to a positive terminal of the battery;
- a second electrical connection directly coupled to a negative terminal of the battery, the first and second electrical connections coupled to a voltage sensor to measure an open circuit voltage across the battery;
- a third electrical connection directly coupled to the positive terminal of the battery;
- a fourth electrical connection directly coupled to a negative terminal of the battery, the third and fourth electrical connections coupled to a forcing function having a time varying component;
- a current sensor electrically in series with the battery;
- a temperature sensor configured to measure a temperature of the battery; and
- a microprocessor configured to determine a dynamic parameter of the battery based upon the measured voltage, the forcing function and the current sensed by the current sensor, and further configured to predict a discharge voltage of the battery as a function of the measured battery dynamic parameter, a calculated activation voltage of the battery and fixed current value at which the battery is to be discharged.

16. The apparatus of claim 15 wherein the microprocessor is further configured to compare the discharge voltage with a minimum starting voltage.

17. The apparatus of claim 16 wherein the microprocessor is further configured to provide an output indicative of the vehicle starting capability of the battery based on the comparison of the discharge voltage with the minimum starting voltage.

18. A method of determining the starting capability of a vehicle, comprising:
(a) measuring a dynamic parameter of a vehicle battery;
(b) obtaining an open circuit voltage of the battery;
(c) measuring a temperature of the battery;
(d) obtaining a fixed current value at which the battery is to be discharged during the start;
(e) calculating an activation voltage based on the measured and obtained conditions of the battery in steps (b) and (c); and
(f) predicting a discharge voltage of the battery as a function of the measured battery dynamic parameter, the calculated activation voltage of the battery and the fixed current value, the discharge voltage indicative of the starting capability of the vehicle.

19. The method of claim 18 further comprising comparing the discharge voltage with a minimum starting voltage.

20. The method of claim 19 further comprising providing an output indicative of the starting capability of the vehicle based on the comparison of the discharge voltage with the minimum starting voltage.

* * * * *

UNITED STATES PATENT AND TRADEMARK OFFICE
CERTIFICATE OF CORRECTION

PATENT NO. : 7,081,755 B2  Page 1 of 1
APPLICATION NO. : 10/654098
DATED : July 25, 2006
INVENTOR(S) : Klang et al.

It is certified that error appears in the above-identified patent and that said Letters Patent is hereby corrected as shown below:

On the title page item (56), Under References Cited change "4,363,407 12/1982 Buckler et al." to --4,363,407 12/1982 Barkler et al.--.

Column 12, line 25, after "and" add --a--.

Signed and Sealed this

Ninth Day of January, 2007

JON W. DUDAS
*Director of the United States Patent and Trademark Office*